United States Patent
Jang et al.

(10) Patent No.: US 7,268,407 B2
(45) Date of Patent: Sep. 11, 2007

(54) SCHOTTKY BARRIER TUNNEL SINGLE ELECTRON TRANSISTOR AND METHOD OF MANUFACTURING THE SAME

(75) Inventors: Moon Gyu Jang, Daejeon (KR); Yark Yeon Kim, Daejeon (KR); Jae Heon Shin, Daejeon (KR); Seong Jae Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 64 days.

(21) Appl. No.: 11/196,180

(22) Filed: Aug. 3, 2005

(65) Prior Publication Data

US 2006/0118899 A1    Jun. 8, 2006

(30) Foreign Application Priority Data

Dec. 3, 2004    (KR) ............... 10-2004-0100828

(51) Int. Cl.
*H01L 31/07* (2006.01)
(52) U.S. Cl. ............ 257/471; 257/471; 257/472; 257/473
(58) Field of Classification Search ........ 257/471, 257/472, 473
See application file for complete search history.

(56) References Cited

U.S. PATENT DOCUMENTS 6,339,005 B1    1/2002    Bryant et al.
6,495,890 B1 *  12/2002   Ono ..................... 257/387

FOREIGN PATENT DOCUMENTS

| JP | 2002 237602 | 8/2002 |
|----|-------------|--------|
| KR | 100434534 | 5/2000 |
| KR | 1020030073098 | 9/2003 |
| KR | 1020040015417 | 2/2004 |
| KR | 1020040022605 | 3/2004 |

OTHER PUBLICATIONS

'Fabrication Method for IC-Oriented Si Single-Electron Transistors' Ono et al., IEEE Transactions on Electron Devices, vol. 47, No. 1, Jan. 2000, pp. 147-153.

* cited by examiner

*Primary Examiner*—Andy Huynh
*Assistant Examiner*—Thinh T Nguyen
(74) *Attorney, Agent, or Firm*—Ladas & Parry LLP

(57) ABSTRACT

Provided are a Schottky barrier tunnel single electron transistor and a method of manufacturing the same that use a Schottky barrier formed between metal and semiconductor by replacing a source and a drain with silicide as a reactant of silicon and metal, instead of a conventional method of manufacturing a single electron transistor (SET) that includes source and drain regions by implanting dopants such that an artificial quantum dot is formed in a channel region. As a result, it does not require a conventional PADOX process to form a quantum dot for a single electron transistor (SET), height and width of a tunneling barrier can be artificially adjusted by using silicide materials that have various Schottky junction barriers, and it is possible to improve current driving capability of the single electron transistor (SET).

6 Claims, 3 Drawing Sheets

SCHOTTKY BARRIER TUNNEL SINGLE ELECTRON TRANSISTOR AND METHOD OF MANUFACTURING THE SAME

CROSS-REFERENCE TO RELATED APPLICATION

This application claims priority to and the benefit of Korean Patent Application No. 2004-100828, filed Dec. 3, 2004, the disclosure of which is incorporated herein by reference in its entirety.

BACKGROUND

1. Field of the Invention

The present invention relates to a Schottky barrier tunnel single electron transistor and a method of manufacturing the same, and more particularly, to a Schottky barrier tunnel single electron transistor and a method of manufacturing the same that uses a Schottky barrier formed between metal and semiconductor by replacing a source and a drain with silicide being a reactant of silicon and metal, instead of a conventional method of manufacturing a single electron transistor (SET) that includes source and drain regions by implanting dopants such that an artificial quantum dot is formed in a channel region.

2. Discussion of Related Art

In general, research on implementation of a silicon-based single electron transistor (SET) and circuit has been consistently conducted in developed countries such as the US, Europe, and Japan.

However, a structure of a single electron transistor that has been implemented up to date typically uses a barrier caused by making an artificial shape in pattern dependent oxidation (PADOX) silicon using a difference of a pattern-dependent oxidation rate.

One conventional method using the PADOX process is a method of manufacturing a single electron transistor described in "Fabrication Method for IC-Oriented Si Single-Electron Transistors", IEEE Transactions on Electron Devices, vol. 47, No. 1, pp. 147-153, 2000/1.

However, the conventional method described above has many drawbacks in that it is difficult to manufacture, to implement a reproducible single electron transistor (SET), and to artificially adjust a design parameter for improving the characteristics. In fact, the PADOX process is difficult to manufacture, and an additional process is required since the process is different from that of a field effect transistor (MOSFET) used for a peripheral circuit.

In other words, a method of implementing a single electron transistor (SET) in silicon using the PADOX and the electrical characteristics thereof are shown, in the conventional method. Specifically, with a V-PADOX process, two single electron transistors (SET) can be manufactured at the same time in a parallel arrangement.

The single electron transistor manufactured like this shows a typical coulomb oscillation characteristic at a low temperature less than 77K. However, with the conventional art, a temperature showing a favorable characteristic of the single electron transistor (SET) is less than 77K and conductivity is less than 1 uS.

To enhance such a low current characteristic, a literal gate structure was devised that connects the single electron transistor (SET) and the field effect transistor (MOSFET) in serial to amplify a low current output from the SET to thus achieve a high voltage gain. However, this has a drawback in terms of low power consumption and small size since the MOSFET is used.

SUMMARY OF THE INVENTION

The present invention is directed to a Schottky barrier tunnel single electron transistor and a method of manufacturing the same that uses a Schottky barrier formed between metal and semiconductor by replacing a source and a drain with silicide being a reactant of silicon and metal, instead of a conventional method of manufacturing a single electron transistor (SET) that includes source and drain regions by implanting dopants such that an artificial quantum dot is formed in a channel region.

One aspect of the present invention is to provide a Schottky barrier tunnel single electron transistor comprising: an insulating layer formed on a substrate; a semiconductor layer formed on a predetermined region of the insulating layer, and having a channel region and source and drain regions separated from each other, wherein at least portions of the source and drain regions are silicided with predetermined metal to make a Schottky junction with the channel region; a gate insulating layer and a gate electrode sequentially formed on the channel region; a sidewall insulating layer formed at both sidewalls of the gate insulating layer and the gate electrode; an interlayer insulating layer pattern formed on the entire surface of the resultant structure to expose a portion of the gate electrode and portions of the source and drain regions; and a metal interconnection formed on the exposed gate electrode and source and drain electrodes.

Another aspect of the present invention is to provide a method of manufacturing a Schottky barrier tunnel single electron transistor comprising: (a) sequentially forming an insulating layer and a semiconductor layer on a substrate; (b) patterning the semiconductor layer to define a channel region and source and drain regions; (c) forming a gate insulating layer and a gate electrode on the channel region; (d) forming a sidewall insulating layer at both sidewalls of the gate insulating layer and the gate electrode; (e) forming and siliciding a metal material to a predetermined thickness on the entire surface of the resultant structure; (f) forming an interlayer insulating layer pattern on the silicided entire structure to expose a portion of the gate electrode and portions of the source and drain regions; and (g) forming a metal interconnection on the exposed gate electrode and source and drain regions.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure is thorough and complete and fully conveys the scope of the invention to those skilled in the art.

Figure 1:
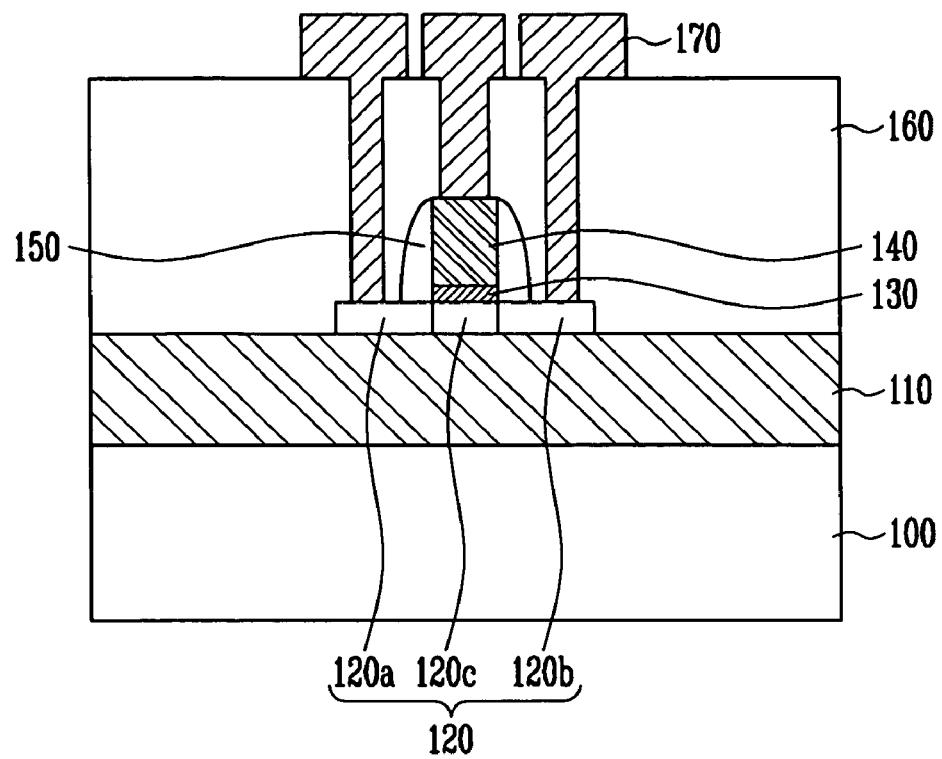
FIG. 1 is a cross sectional view of a Schottky barrier tunnel single electron transistor according to an embodiment of the present invention.

FIG. 1 is a cross sectional view of a Schottky barrier tunnel single electron transistor according to an embodiment of the present invention.

Referring to FIG. 1, the Schottky barrier tunnel single electron transistor according to the embodiment of the present invention is formed on, for example, a silicon on insulator (SOI) substrate. The SOI substrate includes a substrate 100 made of a silicon layer, and an insulating layer 110 and a silicon layer 120 formed on the substrate 100 one after another.

Here, the silicon layer 120 is preferably made of N-type or P-type silicon, and the insulating layer 110 may be a silicon oxide layer.

To achieve desirable characteristics, a thickness of the silicon layer 120 is preferably about less than 20 nm in order to reduce an electrostatic capacitance of a channel region 120c to be used as a quantum dot of a single electron transistor. With the SOI substrate, a gate efficiently adjusts an electric field of the channel region 120c to suppress a current leakage.

In addition, it is desirable that the silicon layer 120 be a substrate having an extremely low impurity concentration less than $10^{16}/cm^3$ or an intrinsic semiconductor without any impurities.

Further, while the Schottky barrier tunnel single electron transistor according to the present invention employs the SOI substrate, the present invention is not limited thereto and may employ a bulk silicon substrate.

In addition, the source and drain region 120a and 120b of the Schottky barrier tunnel single electron transistor according to the present invention are formed of a silicide layer, i.e., a composite of a silicon layer and a metal, and the channel region 120c forms a Schottky barrier.

A gate insulating layer 130 and a gate electrode 140 are formed on the channel region 120c one after another, and a sidewall insulating layer 150 is formed at a gate, i.e., both sidewalls of the gate insulating layer 130 and the gate electrode 140, to insulate between the source and the gate, and the drain and the gate.

In addition, the gate is preferably formed in a double gate or triple gate structure to enhance adjustment capability of a channel region.

An interlayer insulating layer pattern 160 is formed on the surface of the resultant structure to expose a portion of each of the source, the gate and the drain, and a metal interconnection 170 is formed to be in electrically contact with the exposed gate, source and drain.

Figure 2A:
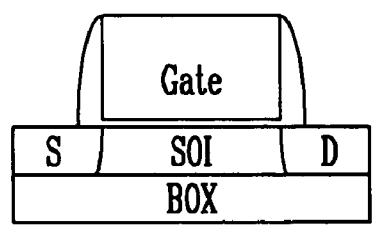
FIG. 2A and 2B is a schematic cross sectional view showing an operational principle of a Schottky barrier tunnel single electron transistor according to an embodiment of the present invention.
Figure 2B:
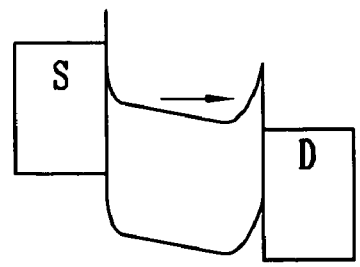

FIG. 2A and 2B is a schematic cross sectional view showing an operational principle of a Schottky barrier tunnel single electron transistor according to an embodiment of the present invention, in which S and D indicate a source and a drain of the Schottky barrier tunnel single electron transistor (SB-SET), respectively, and an SOI indicates a silicon on insulator and a BOX indicates a buried oxide layer, respectively.

The Schottky barrier tunnel single electron transistor of FIG. 2A is formed in a manner very similar to the common field effect transistor (MOSFET), however, a silicide, i.e., a reactant between silicon and metal is used, instead of the impurity injection in a method of forming a source and a drain.

With the silicide, a Schottky barrier is formed at a silicon junction used as the source and the drain, as shown in of FIG. 2B, and this barrier serves as a tunneling barrier of a Schottky barrier tunnel single electron transistor (SB-SET).

Therefore, as a size of the silicon channel is reduced, charging energy of a conduction band grows larger, thus acting as a single electron transistor due to a coulomb blockade phenomenon. This structure has a merit in that it is very simple relative to the prior art, and uses a silicide having a metallic feature as source and drain electrodes.

The Schottky barrier tunnel single electron transistor (SB-SET) manufactured as described above does not require a process for forming an artificial quantum dot, which is a structure proposed in the prior art, and is quite different from the existing single electron transistor in terms of arrangement and operational characteristics in that a Schottky barrier electrically formed between the source and drain made of silicide and the channel made of silicon is used as a single electron tunneling barrier.

Figure 3A:
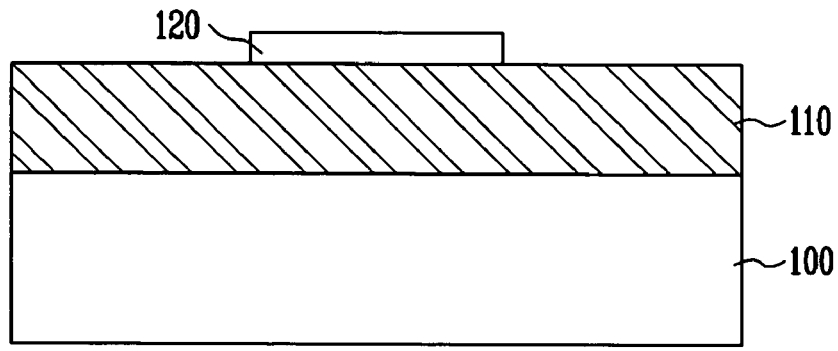
FIGS. 3A to 3E are cross sectional views for explaining a method of manufacturing a Schottky barrier tunnel single electron transistor according to an embodiment of the present invention.

FIGS. 3A to 3E are cross sectional views for explaining a method of manufacturing a Schottky barrier tunnel single electron transistor according to an embodiment of the present invention;

Referring to FIG. 3A, an SOI substrate includes a silicon substrate 100 for mechanical support on the lowermost surface, an insulating layer 110 and a silicon layer 120 formed thereon one after another. Using a predetermined etching mask (not shown), a region where a channel, a source and a drain are to be formed is left while the silicon layer 120 is patterned.

Here, in order to efficiently adjust an electrical field of the channel region (120c, see FIG. 3D) to suppress a current leakage, the SOI substrate is preferably manufactured in the thickness range of several nm to several tens of nm.

In addition, to reduce electrostatic capacitance of the channel region (120c, see FIG. 3D) to be used as a quantum dot of a single electron transistor, the silicon layer 120 is preferably formed to a thickness of less than about 20 nm, and more preferably, from about 1 nm to 20 nm.

Figure 3B:
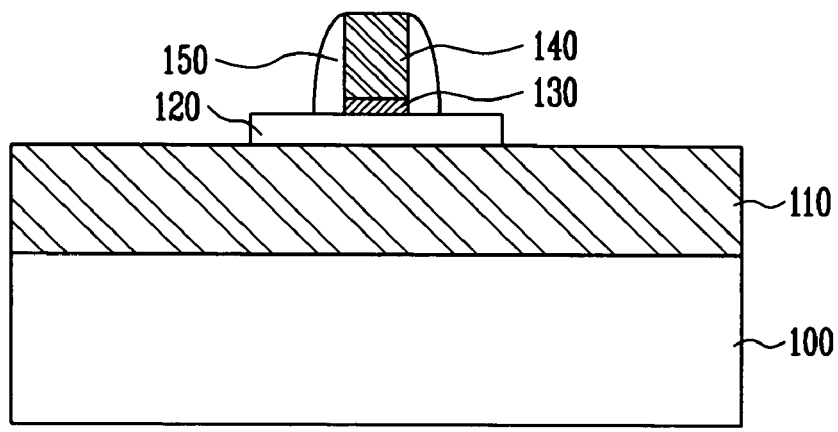

Referring to FIG. 3B, a gate insulating layer 130 and a gate electrode 140 are sequentially formed on a predetermined region of the silicon layer 120. Next, the gate electrode 140 and the gate insulating layer 130 are patterned using an etch mask such as a photoresist, and then etched by a dry etching method. Next, a sidewall insulating layer 150 is formed at the sidewalls of the gate insulating layer 130 and the gate electrode 140.

Here, the gate insulating layer 130 may be typically formed of a silicon oxide layer ($SiO_2$) formed by heat oxidizing silicon, and may be formed of a high-k thin film such as $Al_2O_3$ and $HfO_2$ for higher gate electric field effect.

In addition, the gate electrode 140 may be made of polysilicon currently and widely used, and made of metal such as Al or Ti for improving the performance of the Schottky barrier tunnel single electron transistor (SB-SET).

Further, the sidewall insulating layer 150 is preferably a material having a low dielectric coefficient, if possible, which is typically an insulating layer made of $SiO_2$. In addition, to manufacture a single electron transistor having desirable characteristics, both a gate size and a channel width are preferably manufactured in about less than 10 nm.

Figure 3C:
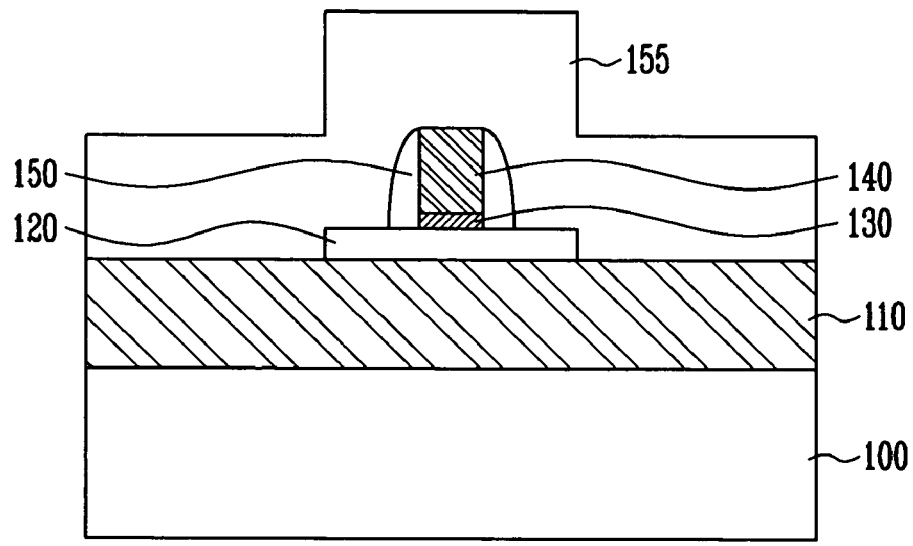

Referring to FIG. 3C, a metal material 155 is deposited to a predetermined thickness on the entire surface of the resultant structure to form a silicide in the source and drain region 120a and 120b.

Here, the metal material 155 may be formed of Erbium, Ytterbium, Platinum, Iridium, Cobalt, Nickel or Titanium.

In particular, when a low Schottky barrier is required upon manufacturing a single electron transistor using electrons, Erbium or Ytterbium is appropriate, while when a relatively higher Schottky barrier is required, Platinum or Iridium is preferably used.

Further, another example transistor corresponding to the single electron transistor is a single hole transistor, which indicates that holes passes through a quantum dot to supply current.

Therefore, in the case that a Schottky barrier single hole transistor SB-SHT is manufactured using a hole, when a low Schottky barrier is required for a hole, Platinum or Iridium is appropriate, while when a high Schottky barrier is required, Erbium or Ytterbium is preferably used.

In addition, when both the single electron transistor and the single hole transistor require an intermediate level of Schottky barrier, Cobalt, Nickel or Titanium is preferably used.

Figure 3D:
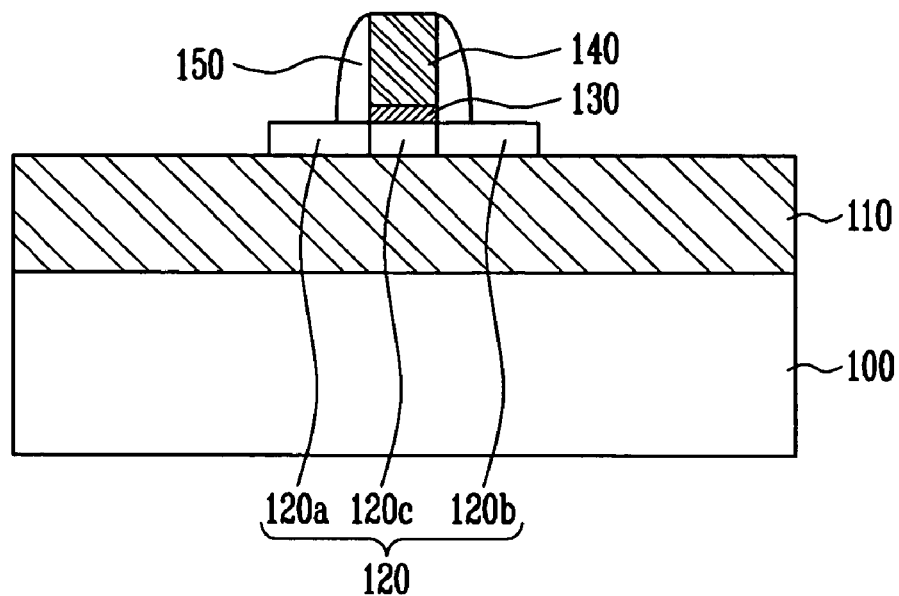

Referring to FIG. 3D, for example, annealing is conducted using a rapid thermal annealing (RTA) apparatus to form the silicide, and then, the non-reacted metal material 155 is removed. In other words, the silicide is formed only on the region where the silicon is exposed, and the non-reacted metal material 155 deposited on the sidewall insulating layer 150 and the insulating layer 110 where there is no silicon is totally removed.

Further, an annealing temperature for forming the silicide is preferably in a range of less than about 600° C., and more preferably, from about 400° C. to 600° C. The reason that such a low annealing temperature is provided is because a high-k gate insulating layer such as $Al_2O_3$ or $HfO_2$ and a metal gate such as Al and Ti described in FIG. 3B should be prevented from a thermal damage.

Figure 3E:
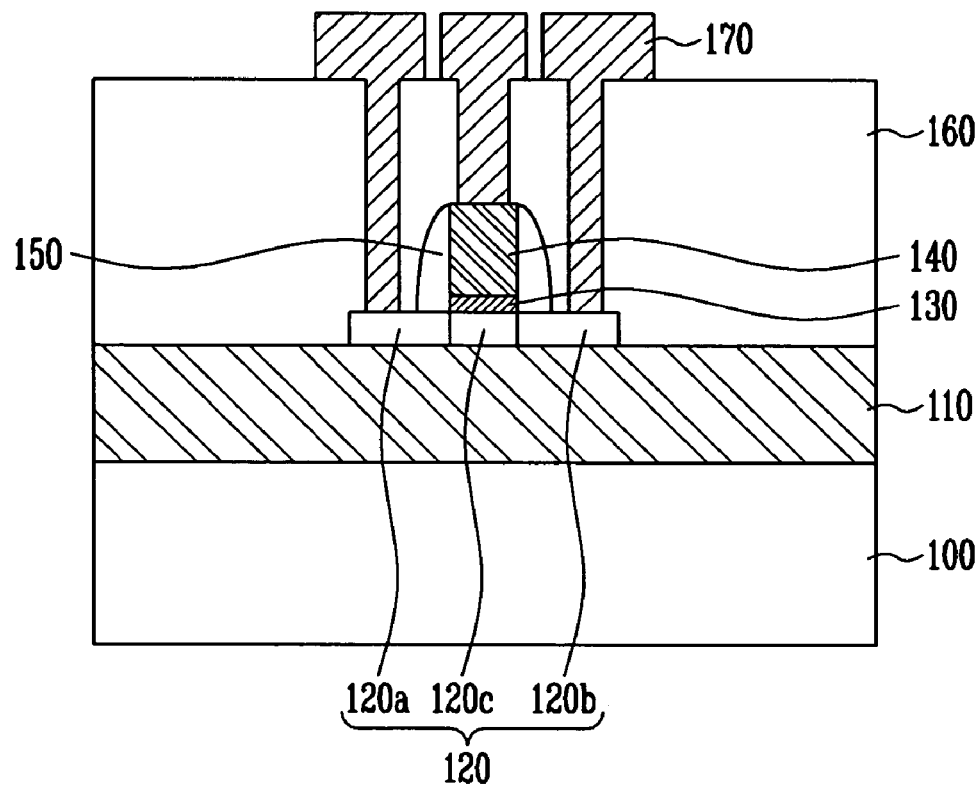

Referring to FIG. 3E, a photoresist is deposited on the entire surface of the resultant structure other than the source, drain, and gate electrodes, and selectively etched to form an interlay insulating layer pattern 160.

Subsequently, a predetermined metal material is deposited on the etched source, drain and gate electrode regions using a planarization process and a contact process to thus form a metal interconnection 170.

The method of manufacturing the single electron transistor using the Schottky barrier according to the embodiment of the present invention does not require a special process for manufacturing a quantum dot in the channel region 120c, and a high temperature process of 600° C. or more is not used at all. Therefore, the high-k gate insulating layer 130 and the metal gate electrode 140 can be readily used.

Further, the method of manufacturing the Schottky barrier tunnel single electron transistor (SB-SET) using the Schottky barrier proposed in the present invention is quite different from the conventional method of implementing a single electron transistor (SET) based on the field effect transistor (MOSFET).

In other words, rather than using the conventional PADOX process or a complicated process such as a sidewall depletion gate described above, the present invention attempts to use a very simple device structure in which the source and drain electrodes have Schottky junctions by a silicide material and barriers formed by the Schottky junctions are used herein as tunneling barriers.

This structure has merits in that it can be manufactured by a very simple process and devices to be used as a peripheral circuit of the single electron transistor (SET) can be manufactured by the same process at the same time. In other words, the Schottky barrier tunnel single electron transistor (SB-SET) and the Schottky barrier field effect transistor (SB-MOSFET) are manufactured at the same time, and a difference of operational characteristics between the single electron transistor (SET) and the field effect transistor (MOSFET) can be simply determined with a device size and an applied voltage.

The Schottky barrier tunnel single electron transistor (SB-SET) according to the embodiment of the present invention has advantages over the prior art as described below.

First, a process such as a PADOX is not required to form a quantum dot for a single electron transistor (SET). With the PADOX method, the quantum dot is difficult to be reproducibly formed, and further, a height or a width of the tunneling barrier is difficult to be artificially adjusted. Current driving capability of the single electron transistor (SET) is difficult to be artificially adjusted, so that an operational temperature as well as a driving current of the single electron transistor is difficult to be adjusted. Thus, it is difficult to implement a high performance single electron transistor (SET) circuit. However, according to the present invention, using a silicide material having various Schottky junction barriers, the height and width of the tunneling barrier can be artificially adjusted.

Second, the silicide adapted to the present invention has a metallic feature, thus further improving current driving capability of the single electron transistor (SET). This is because it has a significantly low sheet resistance value relative to the case that the source and drain use silicon as an electrode and a considerable amount of electrons and holes can be provided.

Third, the silicidation process adapted to the present invention can be performed less than about 600° C., so that it is very easy to adapt a high-k gate insulating layer and a metal gate structure in the future. Thus, a high performance single electron transistor (SET) can be readily implemented.

Fourth, when the single electron transistor (SET) is implemented using a Schottky barrier, the single electron transistor (SET) and the field effect transistor (FET) can be manufactured in the same process without a need for an additional process upon manufacturing a transistor for a peripheral circuit to amplify current and voltage. In other words, when a transistor is manufactured larger than the single electron transistor SET, the single electron transistor SET and the field effect transistor FET can be manufactured in the same process since the transistor herein acts as a Schottky transistor.

As described above, the Schottky barrier tunnel single electron transistor (SB-SET) according to the present invention is a device that enables a tera-level integrated circuit, so that performances of almost all of information and communication hardware can be significantly improved with the low cost and power consumption, based on silicon.

According to the Schottky barrier tunnel single electron transistor and the method of manufacturing the same of the present invention, the Schottky barrier tunnel single electron transistor is manufactured using a Schottky barrier formed between metal and semiconductor by replacing a source and a drain with silicide being a reactant of silicon and metal, instead of the conventional method of manufacturing a single electron transistor (SET) that forms source and drain regions by implanting dopants such that an artificial quantum dot is formed in a channel region. As a result, it does not require a conventional PADOX process to form a quantum dot for a single electron transistor (SET) and height and width of a tunneling barrier can be artificially adjusted by using silicide materials that have various Schottky junction barriers.

In addition, according to the present invention, the silicide made of a metallic material has a significantly low sheet resistance and provides a considerable amount of electrons and holes relative to the case where a source and a drain used for electrodes are made of silicon. Therefore, advantageously, current driving capability of the single electron transistor (SET) can be further improved.

In addition, the present invention has merits in that a silicidation process can be conducted at a low temperature, i.e., less than about 600° C., so that a high-k gate insulating layer and a metal gate structure are readily adapted, and that a high performance single electron transistor (SET) is very easily implemented.

Furthermore, the present invention has merits in that a single electron transistor (SET) implemented with a Schottky barrier does not require an additional process upon manufacturing a transistor for a peripheral circuit to amplify current and voltage, and thus the single electron transistor (SET) and the field effect transistor (FET) can be readily manufactured in the same process at the same time.

Although exemplary embodiments of the present invention have been described with reference to the attached drawings, the present invention is not limited to these embodiments, and it should be appreciated to those skilled in the art that a variety of modifications and changes can be made without departing from the spirit and scope of the present invention.

What is claimed is:

1. A Schottky barrier tunnel single electron transistor comprising:
    an insulating layer formed on a substrate;
    a semiconductor layer formed on a predetermined region of the insulating layer, and having a channel region for a quantum dot of a single electron transfer and source and drain regions separated from each other, wherein at least portions of the source and drain regions are silicided with predetermined metal to make a Schottky junction with the channel region;
    a gate insulating layer and a gate electrode sequentially formed on the channel region;
    a sidewall insulating layer formed at both sidewalls of the gate insulating layer and the gate electrode;
    an interlayer insulating layer pattern formed on the entire surface of the resultant structure to expose a portion of the gate electrode and portions of the source and drain regions; and
    a metal interconnection formed on the exposed gate electrode and source and drain electrodes.

2. The Schottky barrier tunnel single electron transistor according to claim 1, wherein the silicided metal is at least one selected from the group consisting of Erbium, Ytterbium, Platinum, Iridium, Cobalt, Nickel and Titanium.

3. The Schottky barrier tunnel single electron transistor according to claim 1, wherein the semiconductor layer uses a substrate having an impurity concentration of less than $10^{16}/cm^3$ or an intrinsic semiconductor not containing impurities.

4. The Schottky barrier tunnel single electron transistor according to claim 1, wherein the gate electrode is made of one selected from the group consisting of poly-silicon, Al, and Ti.

5. The Schottky barrier tunnel single electron transistor according to claim 1, wherein the gate insulating layer is made of one selected from the group consisting of a silicon oxide layer, an Al oxide layer, and a hafnium oxide layer.

6. The Schottky barrier tunnel single electron transfer according to claim 1, wherein the thickness of the semiconductor layer is less than about 20 nm so as to reduce an electrostatic capacitance of the channel region.

* * * * *